(12) United States Patent
Hao et al.

(10) Patent No.: US 10,115,854 B2
(45) Date of Patent: Oct. 30, 2018

(54) METHOD FOR FORMING A VIRTUAL GERMANIUM SUBSTRATE USING A LASER

(71) Applicants: NEWSOUTH INNOVATIONS PTY LIMITED, Sydney, New South Wales (AU); SHIN SHIN NATURAL GAS CO. LTD., Taiwan (CN); EPISTAR CORPORATION, Taiwan (CN)

(72) Inventors: Xiaojing Hao, Matraville (AU); Martin Andrew Green, Bronte (AU); Ziheng Liu, Maroubra (AU); Wei Li, Kensington (AU); Anita Wing Yi Ho-Baillie, Lane Cove (AU)

(73) Assignee: NewSouth Innovations Pty Limited, Sydney, New South Wales (AU)

( * ) Notice: Subject to any disclaimer, the term of this patent is extended or adjusted under 35 U.S.C. 154(b) by 0 days.

(21) Appl. No.: 15/508,975

(22) PCT Filed: Sep. 4, 2015

(86) PCT No.: PCT/AU2015/000544
§ 371 (c)(1),
(2) Date: Mar. 6, 2017

(87) PCT Pub. No.: WO2016/033641
PCT Pub. Date: Mar. 10, 2016

(65) Prior Publication Data
US 2017/0244005 A1 Aug. 24, 2017

(30) Foreign Application Priority Data

Sep. 4, 2014 (AU) .................... 2014903537

(51) Int. Cl.
*H01L 31/18* (2006.01)
*B23K 26/00* (2014.01)
(Continued)

(52) U.S. Cl.
CPC ...... *H01L 31/1852* (2013.01); *B23K 26/0081* (2013.01); *B23K 26/073* (2013.01);
(Continued)

(58) Field of Classification Search
CPC .................. H01L 31/1852; H01L 31/047
See application file for complete search history.

(56) References Cited

U.S. PATENT DOCUMENTS 4,309,225 A * 1/1982 Fan .................. C30B 1/023
117/8
2006/0292880 A1 12/2006 Son et al.

FOREIGN PATENT DOCUMENTS

JP      H10144606 A    5/1998
WO      2012079113 A1  6/2012

OTHER PUBLICATIONS

Written Opinion for PCT/AU2015/000544 dated Oct. 22, 2015 (6 pages).
(Continued)

*Primary Examiner* — Errol Fernandes
(74) *Attorney, Agent, or Firm* — Michael Best & Friedrich LLP

(57) ABSTRACT

The present disclosure provides a method of manufacturing a semiconductor device. Furthermore the present disclosure provides a photovoltaic device and a light emitting diode manufactured in accordance with the method. The method comprises the steps of forming a germanium layer using deposition techniques compatible with high-volume, low-cost manufacturing, such as magnetron sputtering, and exposing the germanium layer to laser light to reduce the amount of defects in the germanium layer. After the method is performed the germanium layer can be used as a virtual germanium substrate for the growth of III-V materials.

16 Claims, 9 Drawing Sheets

(51) Int. Cl.
  B23K 26/354   (2014.01)
  B23K 26/073   (2006.01)
  B23K 26/082   (2014.01)
  H01L 21/02    (2006.01)
  H01L 31/047   (2014.01)
  B23K 101/34   (2006.01)
  B23K 101/40   (2006.01)
  B23K 103/16   (2006.01)
  B23K 103/00   (2006.01)

(52) U.S. Cl.
  CPC .......... *B23K 26/082* (2015.10); *B23K 26/354* (2015.10); *H01L 21/02381* (2013.01); *H01L 21/02532* (2013.01); *H01L 21/02631* (2013.01); *H01L 21/02683* (2013.01); *H01L 21/02691* (2013.01); *H01L 31/047* (2014.12); *B23K 2201/34* (2013.01); *B23K 2201/40* (2013.01); *B23K 2203/172* (2015.10); *B23K 2203/56* (2015.10)

(56) References Cited

OTHER PUBLICATIONS

International Search Report for PCT/AU2015/000544 dated Oct. 22, 2015 (4 pages).

\* cited by examiner

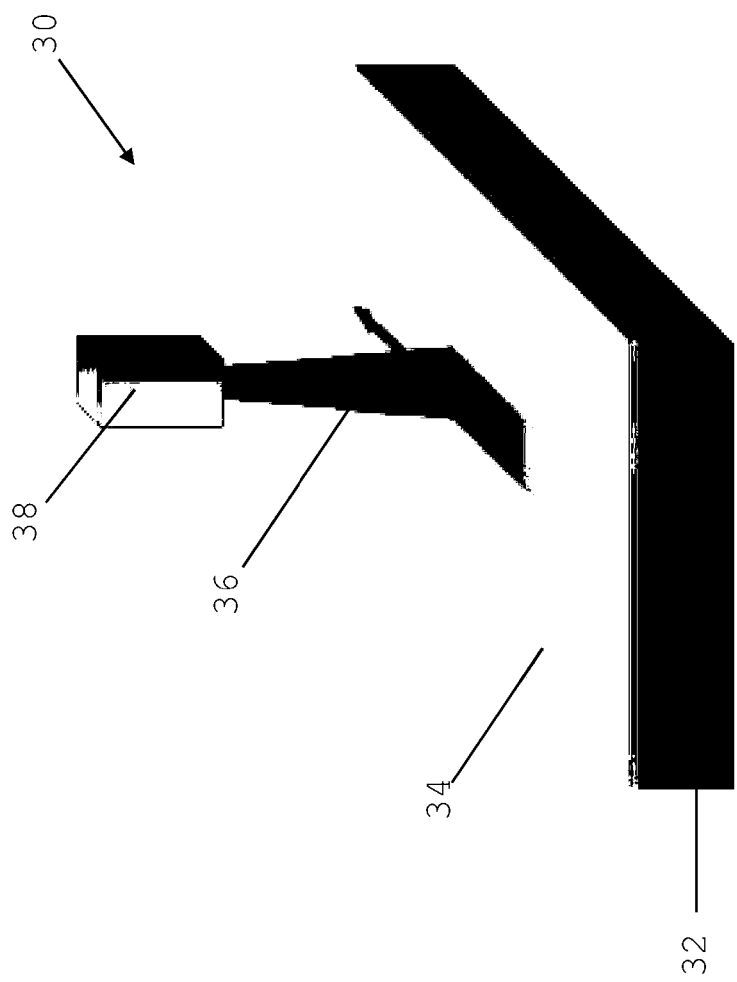

METHOD FOR FORMING A VIRTUAL GERMANIUM SUBSTRATE USING A LASER

FIELD OF THE INVENTION

The present invention generally relates to a method of manufacturing a semiconductor device.

BACKGROUND OF THE INVENTION

Commercial single junction silicon based solar cells have a theoretical conversion efficiency limit of 29%. Record efficiencies of approximately 25% have been demonstrated for laboratory-based solar cells.

Higher conversion efficiencies can be obtained by using stacks of solar cells of different materials on top of each other. To date the highest conversion efficiencies have been obtained using stacks of solar cells based on III-V semiconductor materials. Record devices comprising four stacked III-V based solar cells have reached a conversion efficiency of 44.7% at a concentration of 297 suns.

These III-V stacked solar cells have been employed in space applications for many years. More recently, they have been used in small concentrated solar power plant. The very high manufacturing cost of these cells prevents them from becoming a viable solution for major plants or residential photovoltaic systems.

To achieve very high conversion efficiencies, the III-V materials used to make the photovoltaic device must have an extremely low concentration of physical and electrical defects. In order to reach these defects concentrations the materials must be manufactured on crystalline germanium substrates or epitaxial germanium layers which are lattice matched to the III-V structure.

For example, crystalline germanium provides very good lattice parameters for the growth of a variety of III-V materials. Germanium substrates are used extensively to manufacture III-V based solar cells. However, these substrates are expensive to manufacture and often account for a third of the cost of the whole solar cell device. Epitaxial germanium layers, on the other hand, are grown by molecular beam epitaxy (MBE) or chemical vapour deposition (CVD) techniques. These techniques require high vacuum ($5 \times 10^{-11}$ mbar and $1.5 \times 10^{-9}$ mbar respectively) and use toxic gases such as germane and silane.

One of the challenges to reduce the price of III-V based high efficiency solar cells has been to decrease the cost of the substrates while maintaining the lattice matched properties.

SUMMARY OF THE INVENTION

In accordance with a first aspect, the present invention provides, a method for manufacturing a semiconductor device comprising the steps of:
 providing a substrate;
 forming a germanium layer over the substrate, the germanium layer having a concentration of lattice defects;
 exposing a region of the germanium layer to laser light; and
 forming at least one semiconductor device on a surface portion of the exposed region of the germanium layer;
 wherein the step of exposing the region of the germanium layer to laser light is conducted in a manner such that the concentration of lattice defects at the surface portion is reduced.

The lattice defects may comprise threading dislocation defects. The substrate may comprise silicon material and may be a silicon crystalline wafer having a crystallographic orientation. The concentration of lattice defects in the germanium layer after the method is performed may be less than $10^7$ defects/cm$^2$.

In embodiments, the step of exposing the region of the germanium layer to laser light is conducted such that at least a portion of the region of the germanium layer melts during exposure. The melted portion may comprise the surface portion.

Typically the germanium layer forms an interface with the substrate. The melted portion may extend partially into the region of the germanium layer without reaching the interface, or entirely into the region of the germanium layer reaching the interface.

In some embodiments, the step of forming a germanium layer comprises the step of sputtering Ge, from a sputtering target containing Ge, onto the substrate. The step of sputtering may comprise the step of heating the substrate at a temperature between 200° C. and 400° C.

The sputtering process may be carried out at a pressure between 0.1 mTorr and 5 mTorr. The sputtering rate may be between 1 nm/min and 10 nm/min. Further, the substrate may be rotated at a rotational speed between 10 rev/min and 50 rev/min.

In some embodiments, a dielectric layer is sputtered onto the germanium layer after the germanium layer is deposited. The dielectric layer functions as a protective layer for the germanium layer. The dielectric layer may comprise silicon dioxide. The dielectric layer may be chemically removed after the region of the germanium layer is exposed to laser light, so that the germanium layer is exposed to laser light through the dielectric layer.

In embodiments, the step of exposing a region of the germanium layer to laser light comprises the step of generating a continuous-wave laser beam and directing the continuous-wave laser beam towards a first portion of the germanium layer. The first portion may be located at an edge of the germanium layer.

The laser beam may be moved along the germanium layer from the first portion to a second portion. For example, the laser beam may be moved along the germanium layer at a velocity comprised between 10 mm/min and 1000 mm/min.

Advantageously, by moving the laser beam along the germanium layer, the portion of the germanium layer exposed to the laser beam temporary melts, while the portion is exposed to the laser beam, and quickly recrystallises after the laser beam moves away from the portion. This allows the melted germanium portion to recrystallise with a crystallographic structure and a concentration of defects similar to an adjacent germanium portion that has previously recrystallised. In other words, the germanium layer is melted and recrystallises 'laterally' and quickly. This allows keeping the defect concentration very low, despite the lattice mismatch between silicon and germanium.

The region of the germanium layer may be exposed to the laser beam for an overall time between 10 ms and 500 ms. The laser beam energy density may be between 80 J/cm$^2$ and 350 J/cm$^2$.

In some embodiments, the laser beam is generated using a LIMO continuous-wave diode laser. The laser beam wavelength may be between 230 nm and 1000 nm and the laser beam size may be between 8 mm and 16 mm with a FWHM between 100 µm and 200 µm.

In some embodiments, the substrate and the germanium layer may be heated during the light exposure step. For example, they may be heated to a temperature between 400° C. and 700° C.

In embodiments, the step of forming at least one semiconductor device onto a surface portion of the region of the germanium layer comprises the step of growing a plurality of layers comprising III-V compound materials. The plurality of layers may comprise III-V compound materials and form a multiple junction III-V solar cell with energy conversion efficiency above 30% or a high efficiency light emitting diode.

In accordance with a second aspect, the present invention provides a photovoltaic device manufactured in accordance with the method of the first aspect. The germanium layer may have a thickness between 20 nm and 400 nm.

In embodiments, the at least one solar cell structure comprises a structure of at least three III-V based solar cells.

In some embodiments, the germanium layer may be deposited on a silicon solar cell and the silicon solar cell may be used as a bottom cell in a multi-junction solar cell structure. In these embodiments, the thickness of the germanium layer is kept to a minimum to minimise light absorption be the germanium.

In accordance with the third aspect, the present invention provides a light emitting diode device manufactured in accordance with the first aspect. The germanium layer of the light emitting diode may have a thickness between 100 nm and 500 nm.

Advantageous embodiments provide a method of manufacturing a photovoltaic device or a light emitting diode. The method comprises the step of forming a germanium layer over a silicon substrate and exposing the germanium layer to laser light. The germanium layer may be formed using a PVD technique, such as sputtering, and so avoiding a CVD or MBE step. The sputtered germanium layer comprises lattice defects, such as threading dislocation defects. The concentration of these defects is significantly reduced by means of the laser light. The laser light is moved across the germanium layer and melts portions of the germanium layer which 'laterally' recrystallises with a low concentration of defects. The defects density at the surface of the germanium layer after the laser exposure is low enough to allow the growth of III-V material, creating a 'virtual germanium' substrate for the growth of a multiple junction high efficiency solar cell or high efficiency light emitting diode.

BRIEF DESCRIPTION OF THE DRAWINGS

Features and advantages of the present invention will become apparent from the following description of embodiments thereof, by way of example only, with reference to the accompanying drawings in which:

FIG. 3 is a schematic illustration of a device exposed to laser light in accordance with an embodiment;

DETAILED DESCRIPTION OF EMBODIMENTS

Figure 1:
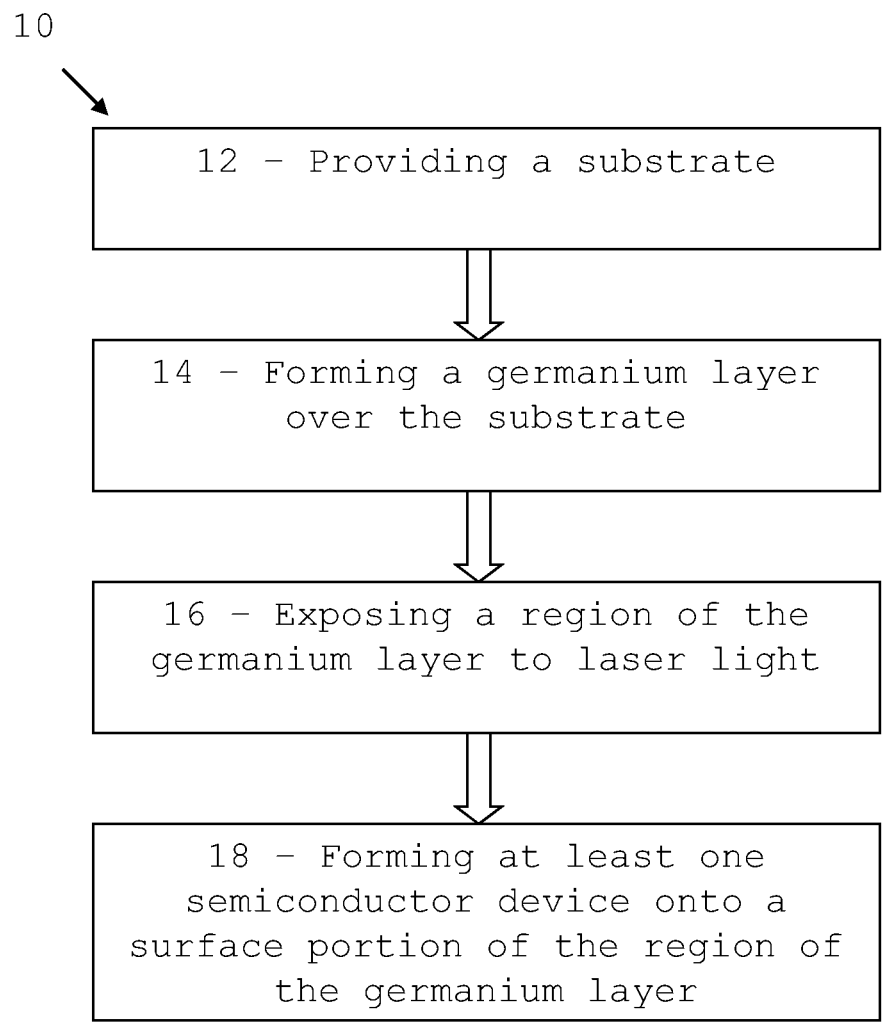
FIGS. 1 and 2 are flow diagrams outlining the basic steps required to manufacture a photovoltaic device in accordance with embodiments.

Embodiments of the present invention relate to a method of manufacturing a semiconductor device using a germanium layer. The method comprises a step of forming the germanium layer and a step of exposing a region of the germanium layer to laser light. The exposure to laser light allows reducing the concentration of defects in the germanium layer. After the exposure, the quality of the germanium layer is such that III-V semiconductor materials can be grown onto the germanium layer to form a solar cell or a light emitting diode. During the exposure of the germanium layer to laser light the concentration of defects, in particular threading dislocation defects, is reduced so that the crystalline properties of the surface portion of the germanium layer, where the semiconductor device is formed, are improved.

Epitaxial germanium layers are generally used for the growth of III-V based high efficiency solar cells. They provide a small lattice mismatch (0.08%) and almost no thermal expansion mismatch with GaAs.

The method disclosed herein allows forming a germanium layer with a surface portion with a crystalline quality which is close to crystalline bulk germanium layers using deposition techniques compatible with the costs and volume constraints typical of the photovoltaic industry, such as sputtering from a target containing germanium onto a crystalline silicon substrate.

Sputtered germanium layers generally contain a concentration of defects which is higher than crystalline bulk germanium layers. A contribution to this defect concentration is provided by the lattice mismatch between the crystalline silicon substrate and the germanium crystalline structure. This mismatch is about 4.2% between germanium and silicon and causes the generation of threading dislocation defects in the Ge layer.

By exposing the sputtered germanium layer to laser light at least a portion of the germanium layer melts. Typically, the laser light is directed to the surface of the germanium layer and moved across the germanium layer so that portions of the germanium layer are melted and 'laterally' recrystallise with a low concentration of defects.

As a result, the crystalline quality and the threading dislocation defects density at the surface become compatible with the growth of gallium arsenide and hence the formation of a multiple junction III-V based high efficiency cell. The method effectively creates a 'virtual germanium' substrate for the growth of the III-V materials.

Properties of the laser light, such as intensity and wavelength, and the exposure time, can be controlled to modify the shape of the melted portion of the germanium layer. For example, the laser light can be controlled in a manner such that the portion of germanium at the interface with the substrate does not melt. Alternatively, the germanium layer can be melted through its entire thickness to provide a lower concentration of defects.

An advantage of melting the germanium layer partially is that the diffusion of silicon into the germanium layer is prevented. In theory, this diffusion may result in the formation of a SiGe alloy on the surface in the germanium layer increasing the lattice mismatch between the germanium layer and the III-V material. However the Applicants have found that, even by melting the germanium layer entirely, only a small amount of silicon diffuses in the germanium layer without affecting the performance of the germanium layer significantly and, at the same time, providing a lower amount of defects.

Referring now to FIG. 1, there is shown a flow-diagram 10 outlining the basic steps required to manufacture a semiconductor device in accordance with embodiments. A substrate is provided, step 12. A germanium layer is then formed over the substrate, step 14. A region of the germanium layer is then exposed to laser light, step 16. Finally, at least one semiconductor device is formed onto a surface portion of the region of the germanium layer, step 18.

Figure 2:
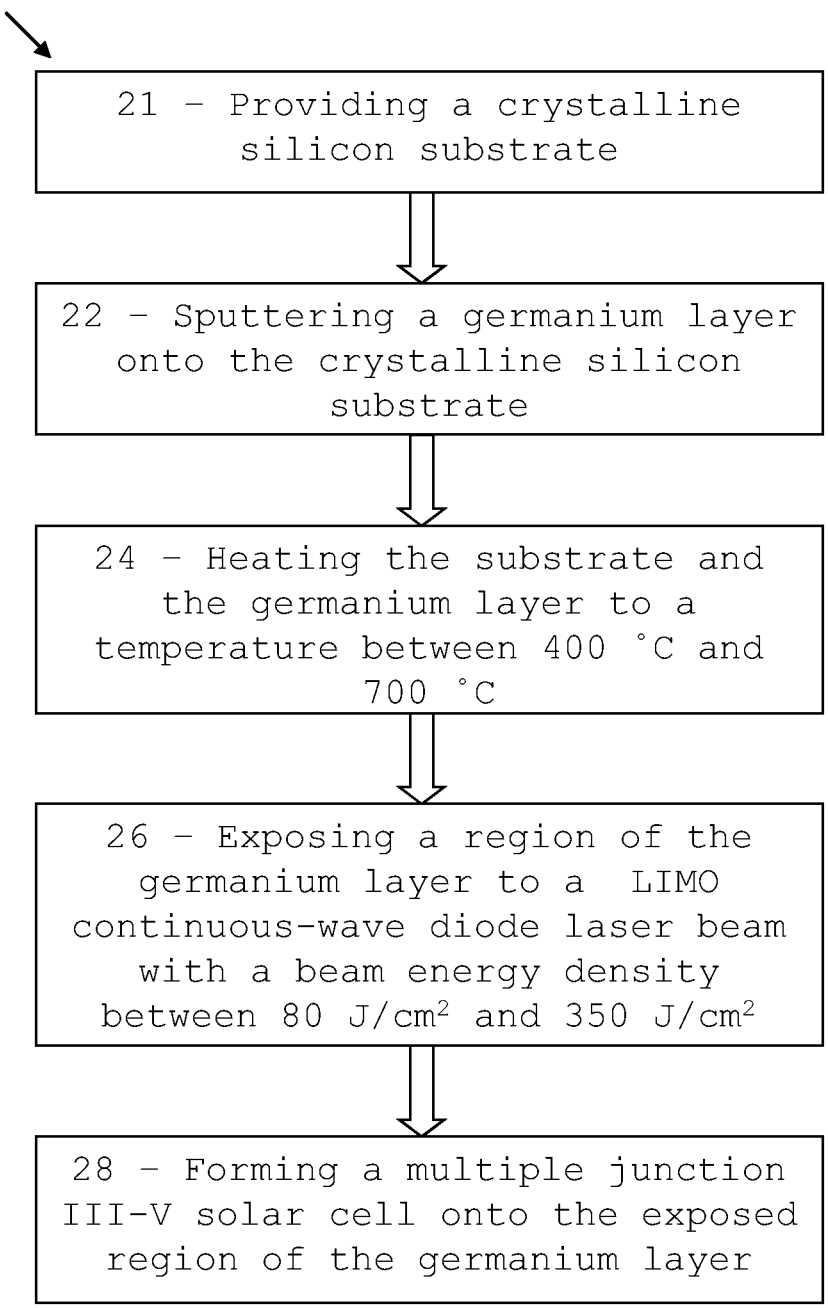

FIG. 2 shows a flow-diagram 20 outlining the steps required to manufacture a photovoltaic device in accordance with an embodiment. In flow-diagram 20, a crystalline silicon substrate is provided, step 21. The germanium layer is then sputtered onto the crystalline silicon substrate, step 22. The difference in lattice parameters between the two materials generates threading dislocation defects in the germanium layer. The silicon substrate and the sputtered germanium layer are then heated to a temperature between 400° C. and 700° C., step 24. A LIMO continuous-wave diode laser beam with a beam energy density between 80 J/cm$^2$ and 350 J/cm$^2$ is scanned over a region of the heated germanium layer, step 26. Finally a multiple junction III-V solar cell is formed onto the exposed region of the germanium layer, step 28.

FIG. 3 shows a device 30 comprising a silicon crystalline substrate 32 and a sputtered germanium layer 34. The device 30 is heated to 600° C. and then exposed to a laser beam 36 from a LIMO continuous-wave (CW) diode laser 38. Laser 38 has line-focus optics, beam size of 12 mm×170 μm FWHM and the wavelength is 808 nm. A single laser beam 36 can be sized to cover width of the germanium layer from side to side. Alternatively an array of diode lasers 38 can be used. The laser beam 38 can be scanned on the germanium layer 34 multiple times at different velocities. Typically the scanning velocity is between 10 mm/min and 500 mm/min and the surface region of the germanium layer is exposed to the laser beam for an overall time between 10 ms and 500 ms. The typical laser beam energy density used is between 80 J/cm$^2$ and 350 J/cm$^2$. In an alternative embodiment, germanium layer 34 can be exposed to the laser beam through a dielectric layer, such as a SiO$_2$ layer. The dielectric layer allows trapping a portion of the laser light in the germanium layer reducing the amount of power required to melt the germanium material. The thickness of the dielectric layer can be selected based on the wavelength of the laser light to optimise trapping of the laser light. In addition, a thicker dielectric layer may help to maintain the surface of the germanium layer smoother.

The germanium layer 34 is deposited by an AJA ATC2200 RF magnetron sputtering system equipped with a quartz halogen lamp substrate heater. Germanium is sputtered from a 4 inch intrinsic Ge target (99.999% purity) at a process pressure of 1 mT at a deposition rate of 5 nm/min. A rotation of 30 revolutions per minute is applied to the substrate during deposition to ensure the uniformity of the films.

Figure 4B:
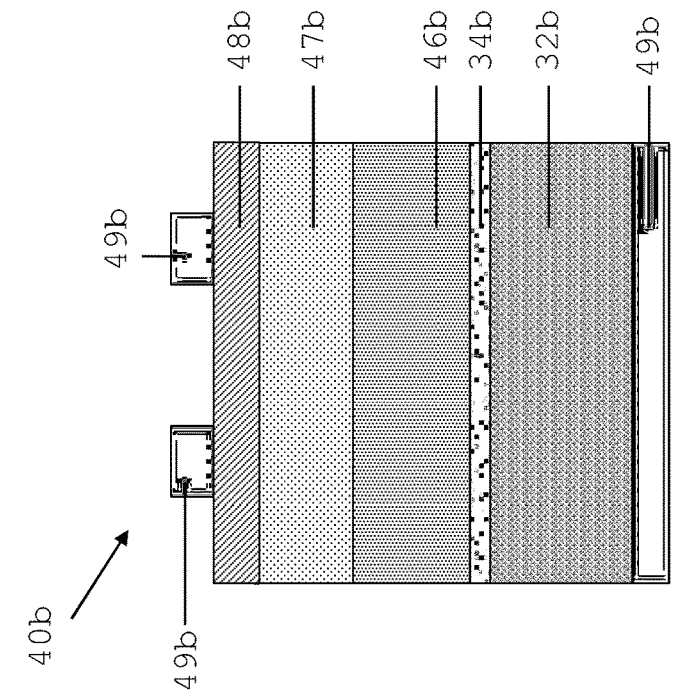
FIG. 4 shows schematic representations of photovoltaic devices in accordance with embodiments.
Figure 4A:
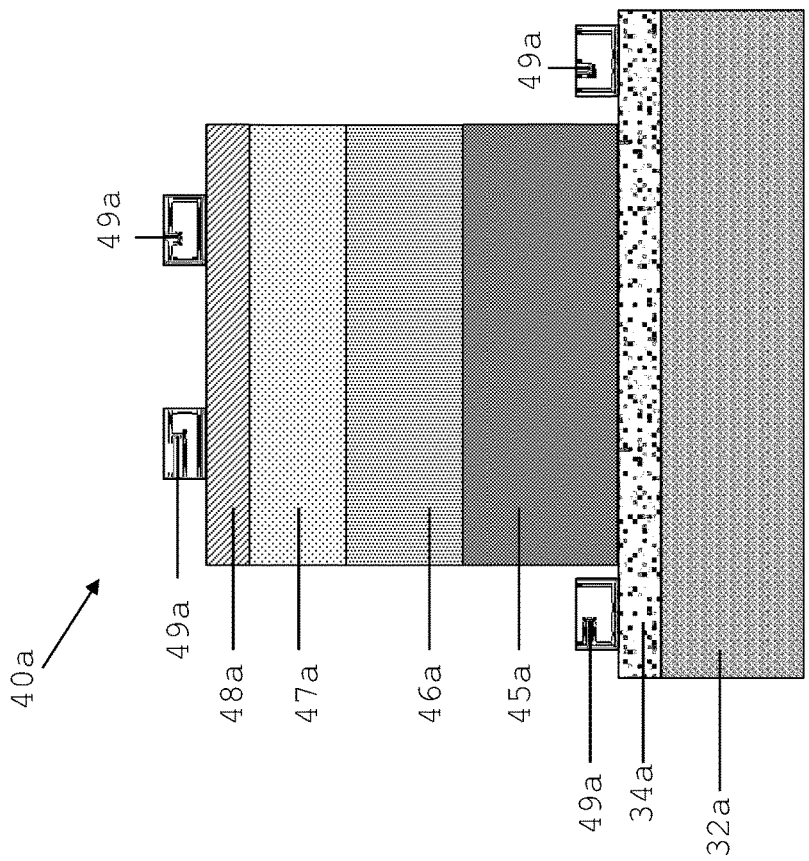
Figure 5B:
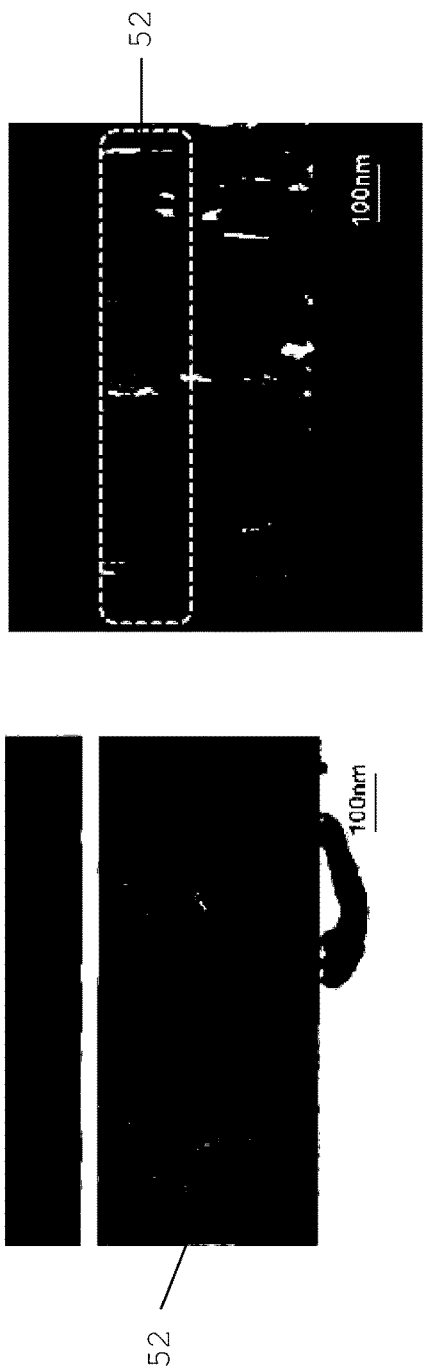
FIGS. 5 and 6 show TEM cross sectional images of germanium layers manufactured in accordance with an embodiment.
Figure 5D:
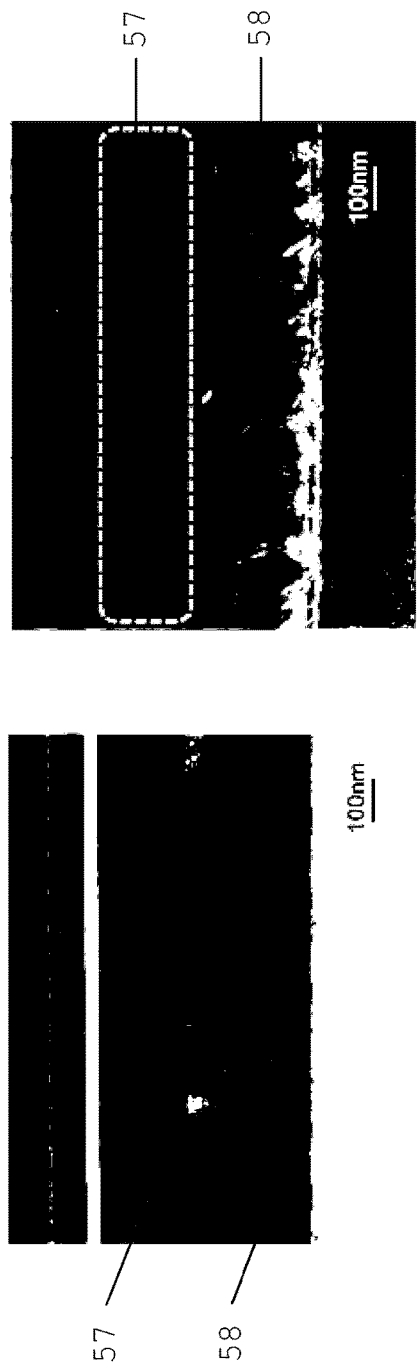
Figure 5A:
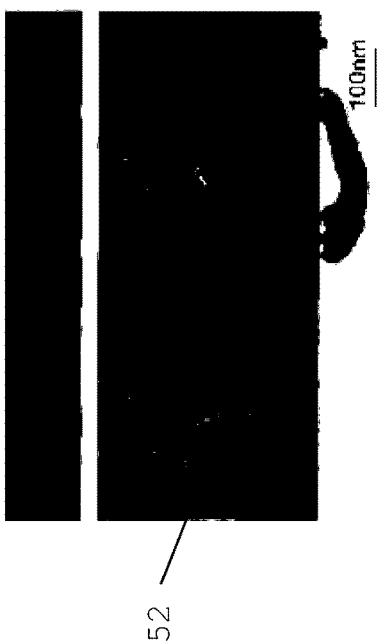
Figure 5C:
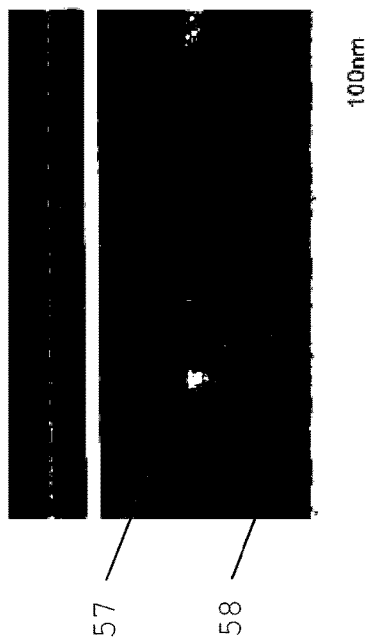

FIG. 4 shows schematic representations of photovoltaic devices 40a and 40b manufactured in accordance with embodiments. Device 40a is a multi-junction III-V solar cell realised on the 'virtual germanium' substrate formed in accordance with embodiments. Device 40a comprises a silicon crystalline substrate 32a, which is an n-type silicon wafer, and laser annealed germanium layer 34a. The silicon substrate 32a is cleaned using RCA solutions followed by a HF dip before depositing the germanium layer. The germanium layer 34a is sputtered while silicon substrate 32a is kept at 300° C. and has a thickness of 300 nm. A 30 nm thick SiO$_2$ capping layer (not shown) is deposited to protect the germanium layer 34a while it is transferred from the sputtering machine to another deposition machine. The SiO$_2$ capping layer is chemically removed before the III-V solar cell is formed onto the germanium layer 34a.

The III-V solar cell comprises a bottom low bandgap III-V solar cell 45a, a middle III-V solar cell 46a with a bandgap higher than the bottom cell, and a top III-V solar cell 47a with a high bandgap which converts high energy photons. Device 40a also comprises a conductive layer 48a and electrical contacts 49a.

Device 40b is a multi-junction III-V solar cell comprising a silicon homojunction bottom cell. In this embodiment, a single junction solar cell 32b is realised first. Subsequently a germanium layer 34b is formed in accordance with embodiments. The device further comprised two III-V solar cells: a middle III-V solar cell 46b with a bandgap higher than the silicon solar cell 32b, and a top III-V solar cell 47b with a high bandgap which converts high energy photons. Device 40b also comprises a conductive layer 48b and electrical contacts 49b. The germanium layer 34b for device 40b is thinner than layer 34a as it has to absorb a minimum amount of photons.

FIGS. 5 and 6 show TEM cross sectional images of a germanium layer treated with laser radiation in accordance with embodiments. The germanium layer in FIGS. 5 and 6 is partially melted during the laser exposure. FIGS. 5(a) and 5(c) are bright field TEM views of germanium whilst FIGS. 5(b) and 5(d) are dark field TEM views. FIGS. 5(a) and 5(b) show the germanium layer before the exposure to laser light, whilst FIGS. 5(c) and 5(d) show the germanium layer after the exposure to laser light with a dose of 280 J/cm$^2$ with a thin dielectric capping layer. FIGS. 5(a) and 5(b) show that the film before diode laser annealing (52) has a high threaded dislocation density which is estimated to be of the order of 10$^{10}$ cm$^{-2}$. After the diode laser exposure step, a top layer 57 which has a very low defect density and a defective bottom layer 58 can be observed in FIGS. 5(c) and 5(d). The threaded dislocation density of the exposed germanium layer is reduced by three orders of magnitude to 10$^7$ cm$^{-2}$.

Figure 6B:
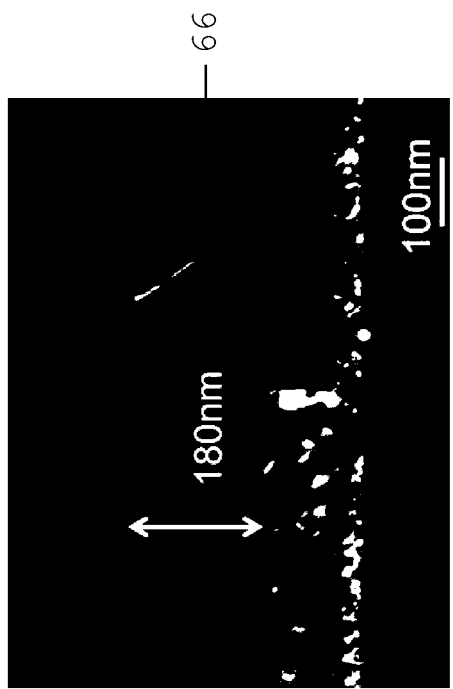
Figure 6A:
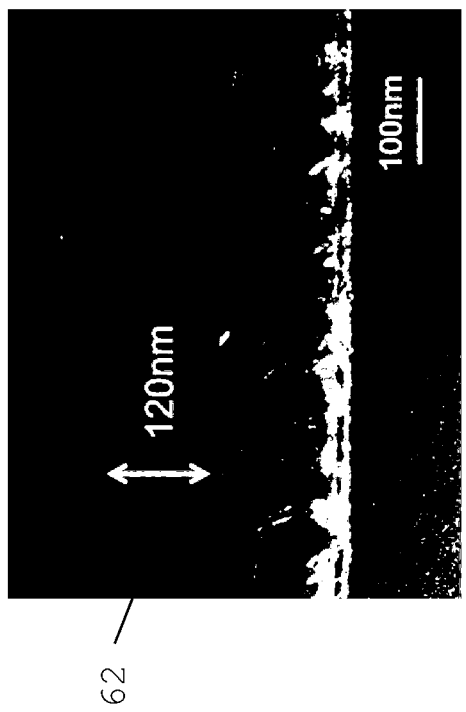

The high quality surface is related to the partial melting of the germanium layer during the diode laser exposure. FIGS. 6(a) and 6(b) illustrate the ability of the continuous wave laser to control the melting depth of the germanium layer 34 by varying the scan times and laser power. FIG. 6(a) shows the depth of the melted germanium extending only partially into the region of the germanium layer without reaching the interface with the silicon substrate. The depth is 120 nm (62) after one laser scan. FIG. 6(b) shows the same sample after five scans resulting in a 180 nm (66) melted germanium layer.

Figure 7A:
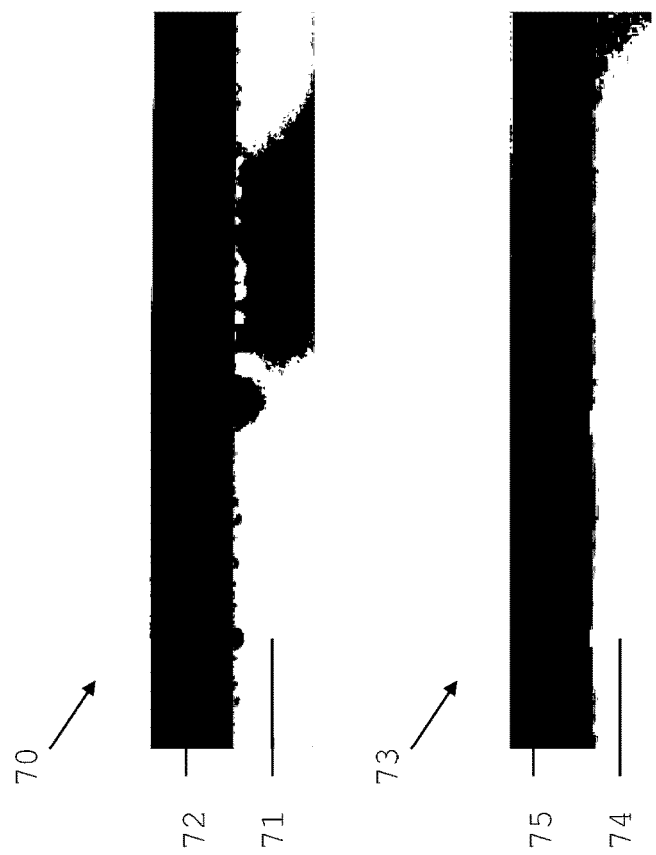
FIG. 7 shows TEM cross sectional images of germanium layers manufactured in accordance with an embodiment (a) and a plot representing the normalized peak temperatures of a germanium layer manufactured in accordance with an embodiment (b)

FIG. 7(a) shows TEM cross sectional images of a germanium layer treated with laser radiation in accordance with embodiments. The germanium layer in FIG. 7(a) has been entirely melted during laser exposure. Image 70 shows the silicon substrate 71 and the 200 nm sputtered germanium layer 72 before the exposure to laser light. Image 73 shows the silicon substrate 74 and the germanium layer 75 after the exposure to laser light with a dose of 80 J/cm$^2$ through a SiO$_2$ capping layer or 150 nm. A full melt is obtained despite the lower dose as a consequence of the light trapping created by the capping layer.

It is evident from FIG. 7(a) that germanium layer 75 has a much lower defect concentration than germanium layer 72. In particular germanium layer 72 has dislocation density in the order of $10^{10}$ cm$^{-2}$; germanium layer 75 has dislocation density in the order of $10^6$-$10^7$ cm$^{-2}$.

Figure 7B:
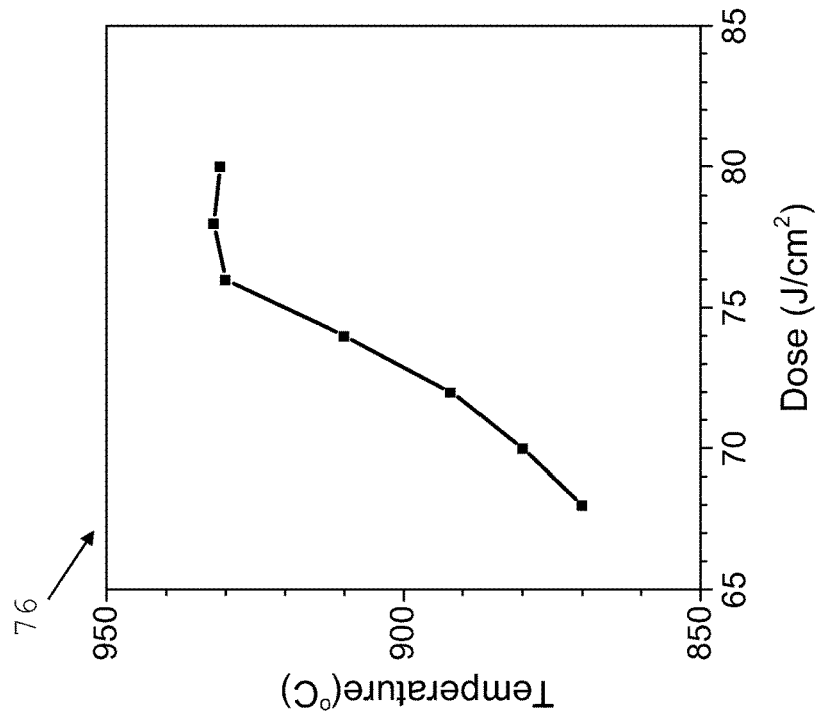

FIG. 7(b) shows a plot 76 of the normalized peak temperatures of a 200 nm sputtered germanium layer exposed through a SiO$_2$ capping layer of 150 nm for different laser doses.

With increasing laser dosage, the temperature of layer first increases linearly and then saturates at the melting temperature due to absorption of latent heat. A full melt can be obtained using low doses as a consequence of the light trapping created by the capping layer.

By meting the germanium layer entirely, silicon from the substrate may diffuse in the germanium layer. This may result in the formation of a SiGe alloy on the surface in the germanium layer which could increase the lattice mismatch between the germanium layer and the III-V material.

Figure 8:
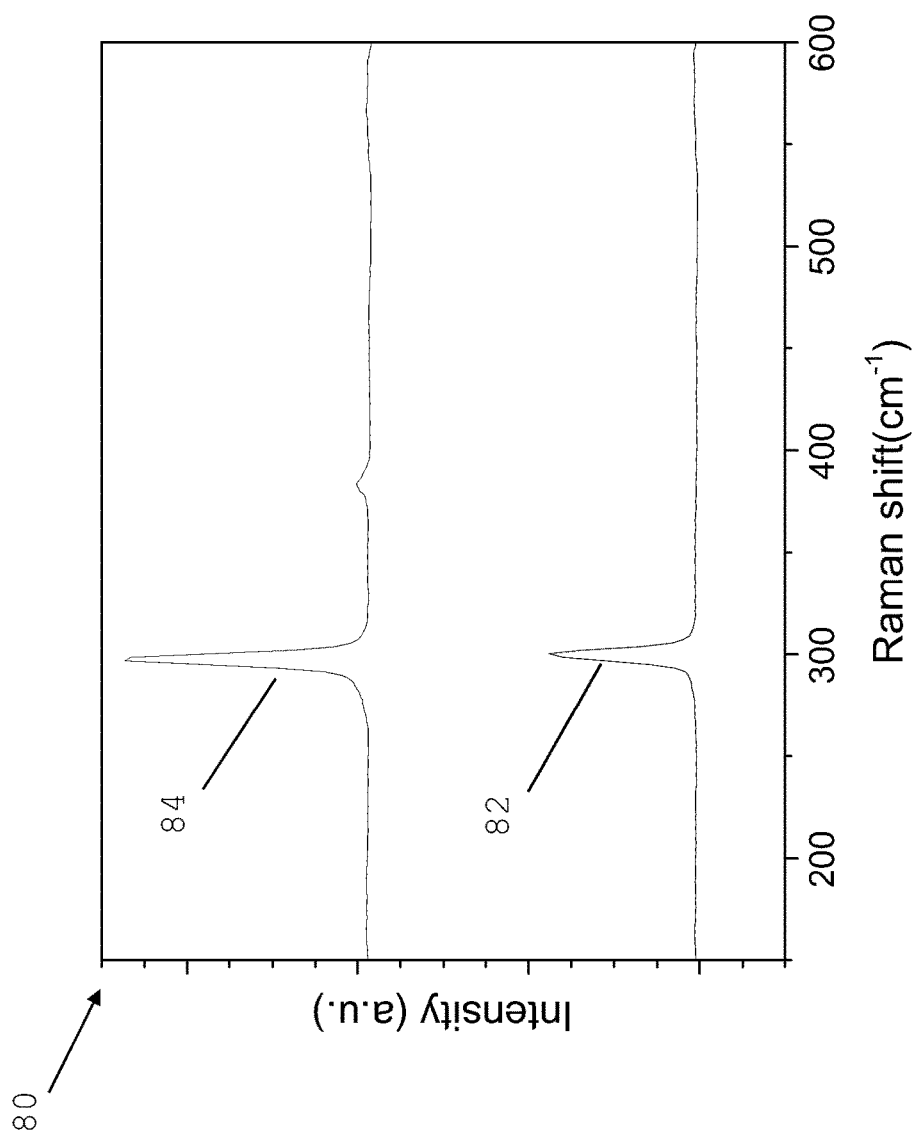
FIG. 8 shows a Raman comparison between a germanium layer as-deposited and a germanium layer annealed in accordance with embodiments.

FIG. 8 shows a Raman plot 80 with two traces with the SiGe Raman peak for a germanium layer before 82 and after 84 a laser annealing with a dose of 80 J/cm$^2$. The similarity of the peaks in plot 80 proves that, even by melting the germanium layer entirely, only a small amount of silicon diffuses in the germanium layer.

Figure 9:
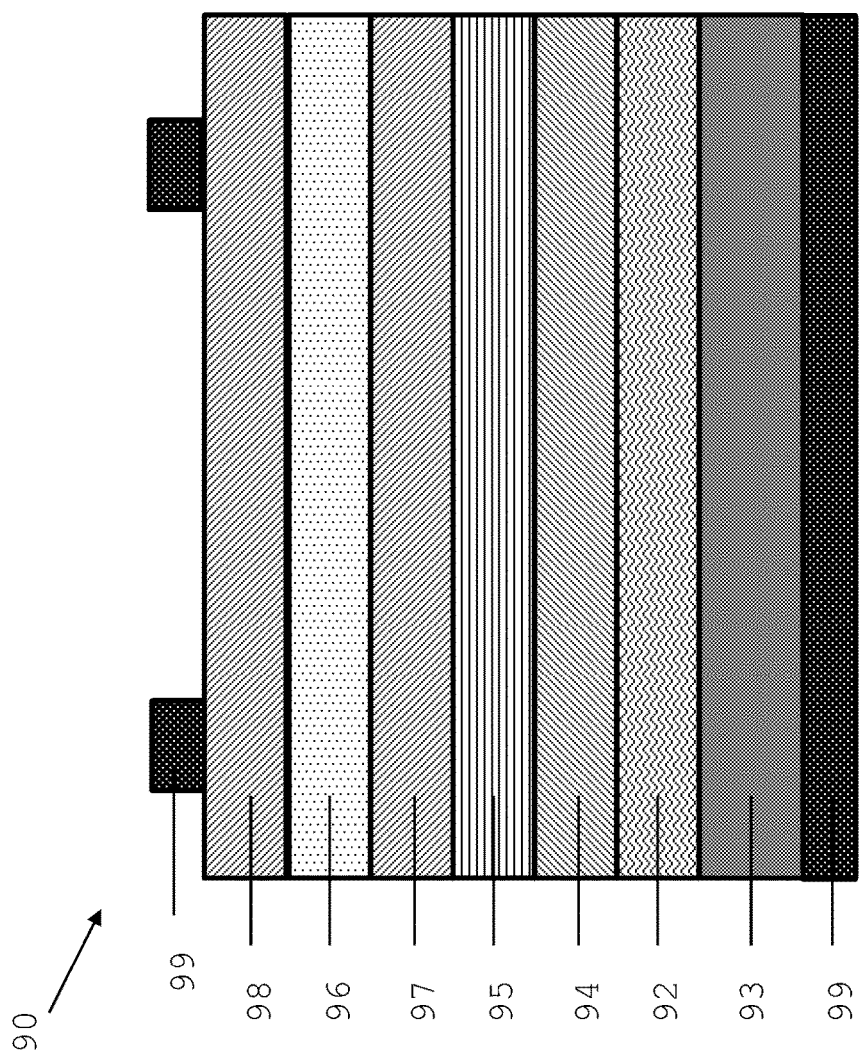
FIG. 9 shows schematic representations of a light emitting diode device in accordance with embodiments.

Referring now to FIG. 9, there is shown a schematic representation of a light emitting diode structure 90. The diode is formed by a series of III-V semiconductor layers and can emit light with wavelengths in the range 560 nm to 1100 nm. The III-V semiconductor layers are formed on a germanium layer 92 formed in accordance with embodiments. The germanium layer 92 is formed on a silicon substrate 93, a buffer layer 94 (which could be made of GaAs or GaInP) is formed on the germanium layer 92 and a DBR (Distributed Bragg reflector) layer 95, which can reflect the light generated from the light emitting layer 96, is formed on the buffer layer 94.

A light emitting structure comprising a first conductive type layer 97, a light emitting layer 96, and a second conductive type layer 98, is formed on the DBR layer 95.

Metallic contacts 99 are provided on the on the second conductive type layer 98 and on the backside of silicon wafer 93 to apply a voltage to the LED device. The lattice constants of 94, 95, 97 and 96 are similar to the lattice constant of germanium layer 92.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The claims as defined in the invention are as follows:

1. A method for manufacturing a semiconductor device comprising the steps of:
    providing a substrate;
    forming a germanium layer over the substrate, the germanium layer having a concentration of lattice defects;
    depositing a dielectric layer onto the germanium layer; thereafter
    exposing a region of the germanium layer to laser light through the dielectric layer; thereafter
    removing the dielectric layer; and thereafter
    forming at least one semiconductor device on a surface portion of the exposed region of the germanium layer comprising growing a plurality of layers comprising III-V compound materials on the formed germanium layer;
    wherein the step of exposing the region of the germanium layer to laser light comprises: generating a continuous-wave laser beam and directing the continuous-wave laser beam towards a first edge of the germanium layer and laterally moving the laser beam along the length of the germanium layer from the first edge to a second edge.

2. The method in accordance with claim 1 wherein the concentration of lattice defects in the germanium layer after the method is performed is less than $10^7$ defects/cm$^2$.

3. The method in accordance with claim 1 wherein the step of exposing the region of the germanium layer to laser light is conducted such that at least a portion of the region of the germanium layer melts during exposure.

4. The method in accordance with claim 3 wherein the melted portion comprises the surface portion.

5. The method in accordance with claim 3 wherein the germanium layer forms an interface with the substrate and the melted portion extends from the surface portion to the interface.

6. The method in accordance with claim 3 wherein the germanium layer forms an interface with the substrate and the melted portion extends only partially into the region of the germanium layer without reaching the interface.

7. The method in accordance with claim 1 wherein the step of forming a germanium layer comprises the step of sputtering Ge, from a sputtering target containing Ge, onto the substrate.

8. The method in accordance with claim 1 wherein the thickness of the dielectric layer is selected based on the wavelength of the laser light.

9. The method in accordance with claim 1 wherein the method further comprises the step of moving the laser beam along the germanium layer from the first portion to a second portion at a velocity comprised between 10 mm/min and 1000 mm/min.

10. The method in accordance with claim 1 wherein the portion of the germanium laser exposed to the laser beam temporary melts, while the portion is exposed to the laser beam, and quickly recrystallises after the laser beam moves away from the portion.

11. The method in accordance with claim 1 wherein the region of the germanium layer is exposed to the laser beam for an overall time between 10 ms and 500 ms.

12. The method in accordance with claim 1 wherein the laser beam energy density is between 80 J/cm$^2$ and 350 J/cm$^2$.

13. The method in accordance with claim 1 wherein the method further comprises the step of heating the substrate and the germanium layer to a temperature comprised between 400° C. and 700° C. during the exposure of a region of the germanium layer to laser light.

14. The method in accordance with claim 1 wherein the substrate is a silicon crystalline wafer with a crystallographic orientation.

15. The method in accordance with claim 1 wherein the plurality of layers comprising III-V compound materials form a multiple junction III-V solar cell with an energy conversion efficiency above 30%.

16. The method in accordance with claim 1 wherein the scanning of the continuous-wave laser beam on the germanium layer is conducted in a manner such that the concentration of lattice defects at the surface portion is reduced.

* * * * *